United States Patent [19]
Cook et al.

[11] Patent Number: 5,180,467
[45] Date of Patent: Jan. 19, 1993

[54] ETCHING SYSTEM HAVING SIMPLIFIED DIFFUSER ELEMENT REMOVAL

[75] Inventors: Roger D. Cook, Manteca; Daniel V. Milina, Los Gatos, both of Calif.

[73] Assignee: VLSI Technology, Inc., San Jose, Calif.

[21] Appl. No.: 565,621

[22] Filed: Aug. 10, 1990

Related U.S. Application Data

[63] Continuation-in-part of Ser. No. 564,801, Aug. 8, 1990, abandoned.

[51] Int. Cl.⁵ .............................................. B44C 1/22
[52] U.S. Cl. ................................... 156/643; 156/345; 156/646
[58] Field of Search ....................... 156/345, 643, 646; 204/192.32, 298.33, 298.34, 298.35, 298.36, 298.37, 298.38, 298.39; 118/50.1, 620; 427/38, 39

[56] References Cited

U.S. PATENT DOCUMENTS

| | | | |
|---|---|---|---|
| 4,209,357 | 6/1980 | Gorin et al. | 204/298.33 X |
| 4,585,920 | 4/1986 | Hoog et al. | 156/345 X |
| 4,600,464 | 7/1986 | Desilets et al. | 156/345 |
| 4,612,077 | 9/1986 | Tracy et al. | 156/345 |
| 4,780,169 | 10/1988 | Stark et al. | 156/345 |
| 4,820,371 | 4/1989 | Rose | 156/345 |
| 4,859,303 | 8/1989 | Kalnitsky et al. | 204/192.36 |
| 4,960,488 | 10/1990 | Law et al. | 156/643 |

Primary Examiner—William A. Powell
Attorney, Agent, or Firm—Burns, Doane, Swecker & Mathis

[57] ABSTRACT

Using systems and methods wherein the diffuser element can be removed independently of upper electrode assembly removal, maintenance time associated with diffuser plate cleaning can be substantially reduced (e.g., several hours per week of operation). Because a diffuser element should typically be cleaned at least 3-4 times more frequently than the upper electrode assembly, maintenance costs over the course of an annual operating period can therefore be reduced significantly. Further, use of a diffuser element which can be independently removed permits portions of an upper electrode assembly to be frequently cleaned in place, thus further enhancing operability of the etching system without increasing operating costs.

12 Claims, 5 Drawing Sheets

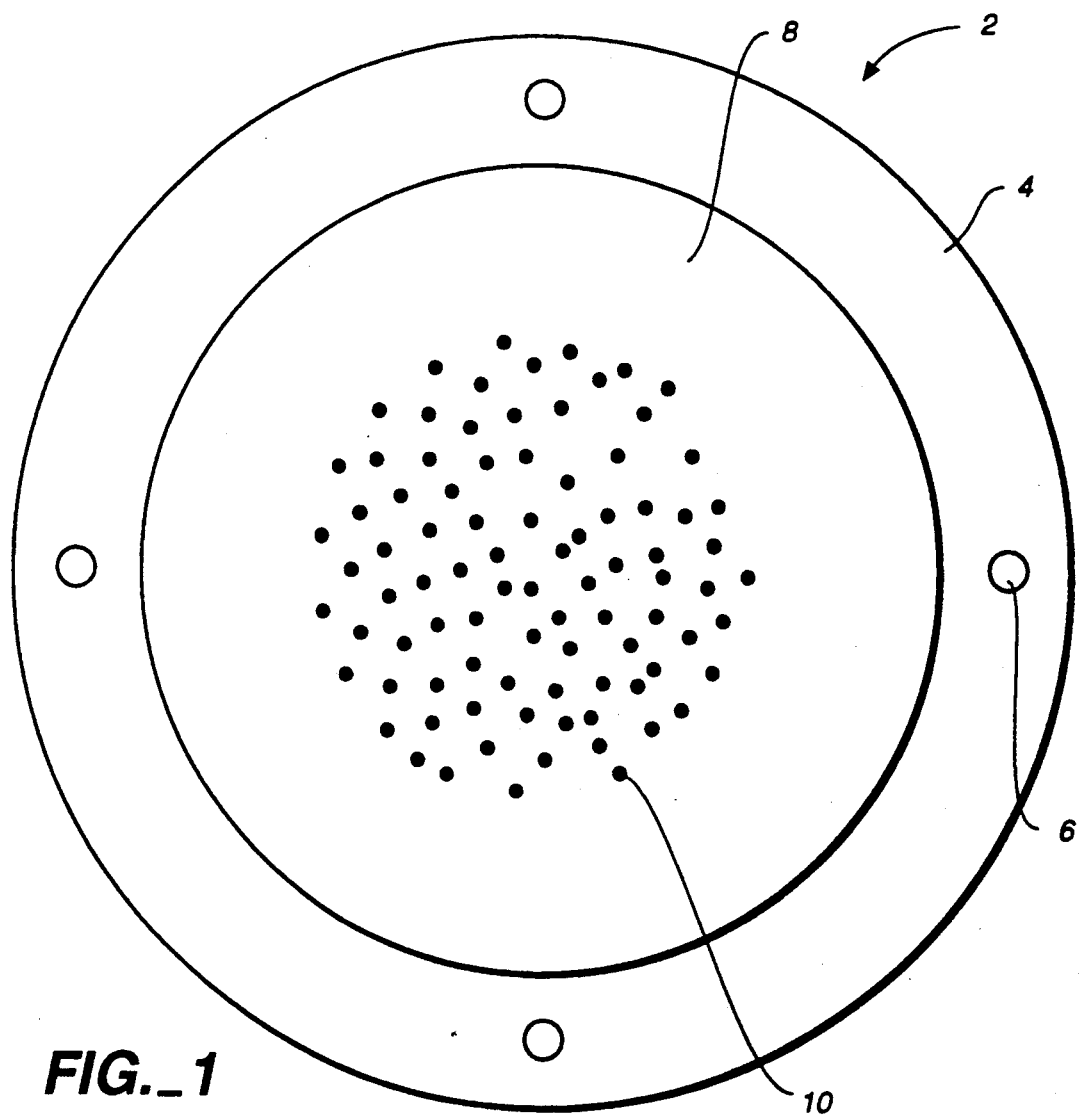
FIG._1

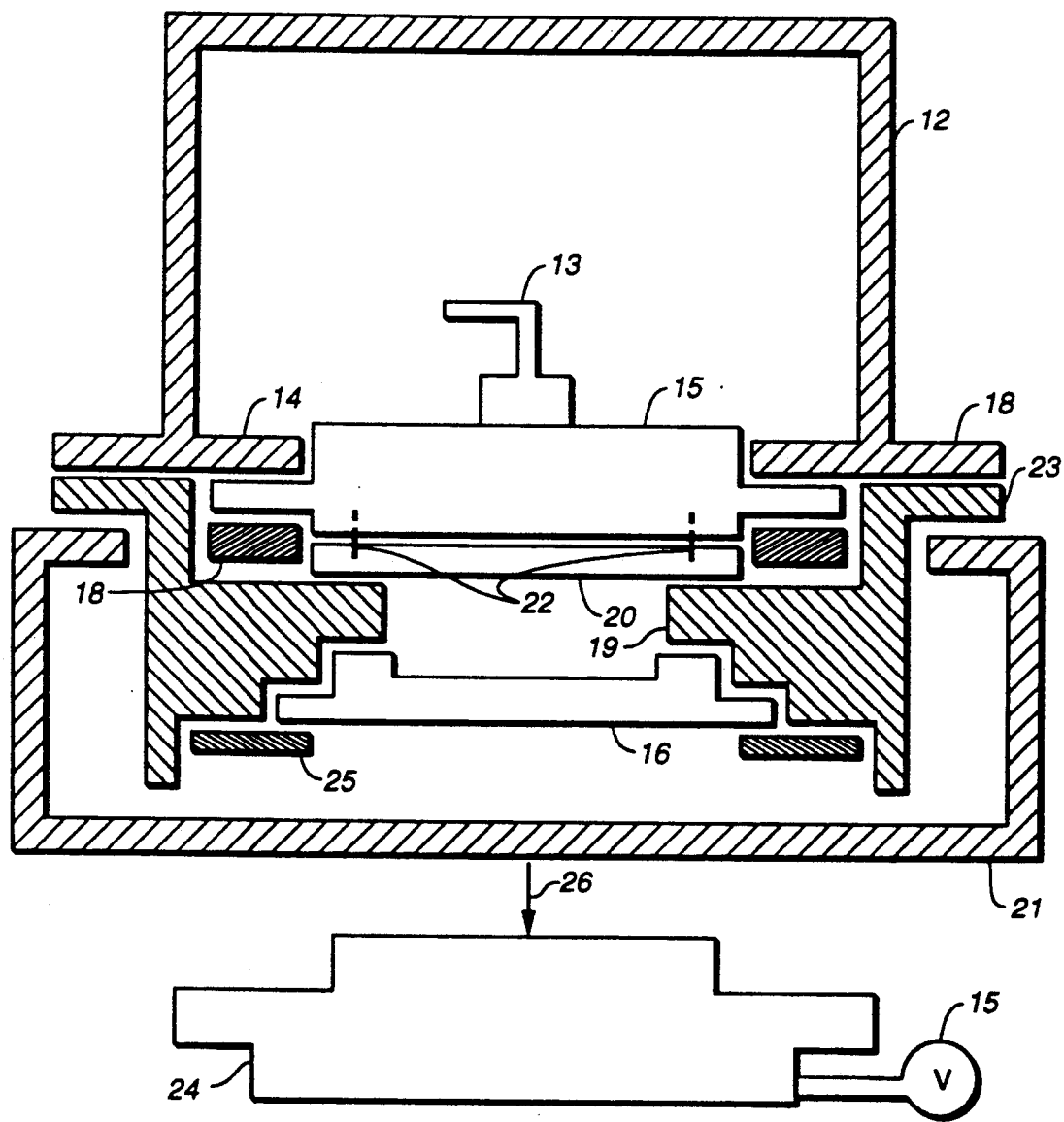
FIG._2

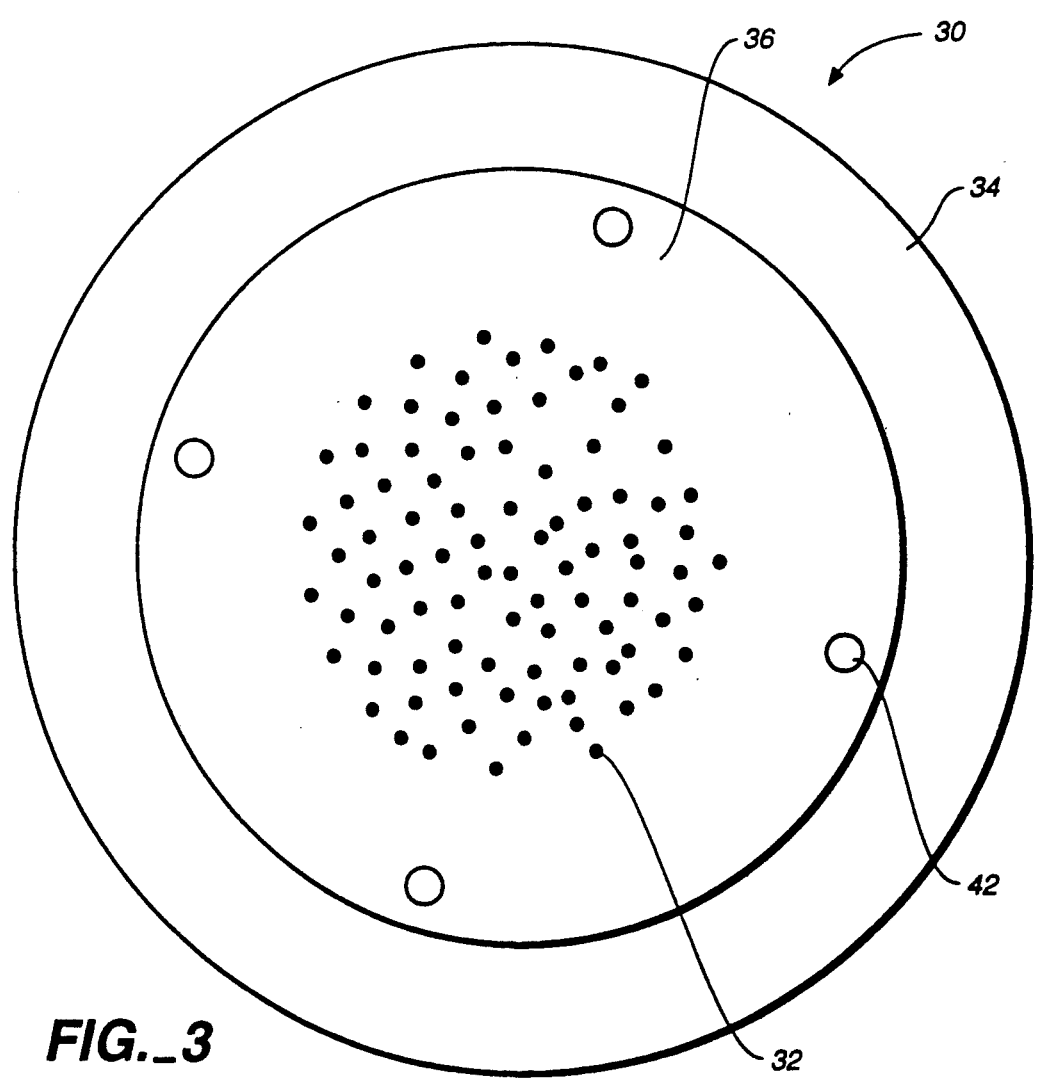
FIG._3

|   | ① | ② | ③ | ④ | ⑤ | ⑥ | ⑦ |
|---|---|---|---|---|---|---|---|
| 1. | 0° | 30° | 0° | 0° | 9° | 0° | 9° |
| 2. | 120° | 90° | 36° | 22.5° | 27° | 18° | 27° |
| 3. | 240° | 150° | 72° | 45° | 45° | 36° | 45° |
| 4. |  | 210° | 108° | 67.5° | 63° | 54° | 63° |
| 5. |  | 270° | 144° | 90° | 81° | 72° | 81° |
| 6. |  | 330° | 180° | 112.5° | 99° | 90° | 99° |
| 7. |  |  | 216° | 135° | 117° | 108° | 117° |
| 8. |  |  | 252° | 157.5° | 135° | 126° | 135° |
| 9. |  |  | 288° | 180° | 153° | 144° | 153° |
| 10. |  |  | 334° | 202.5° | 171° | 162° | 171° |
| 11. |  |  |  | 225° | 189° | 180° | 189° |
| 12. |  |  |  | 247.5° | 207° | 198° | 207° |
| 13. |  |  |  | 270° | 225° | 216° | 225° |
| 14. |  |  |  | 292.5° | 243° | 234° | 243° |
| 15. |  |  |  | 315° | 261° | 252° | 261° |
| 16. |  |  |  | 337.5° | 279° | 270° | 279° |
| 17. |  |  |  |  | 297° | 288° | 297° |
| 18. |  |  |  |  | 315° | 306° | 315° |
| 19. |  |  |  |  | 333° | 324° | 333° |
| 20. |  |  |  |  | 351° | 342° | 351° |
| 21. |  |  |  |  |  |  |  |
| 22. |  |  |  |  |  |  |  |
| 23. |  |  |  |  |  |  |  |
| 24. |  |  |  |  |  |  |  |
| 25. |  |  |  |  |  |  |  |
| 26. | .139R | .280R | .470R | .672R | .890R | 1058R | 1.278R |

FIG._4

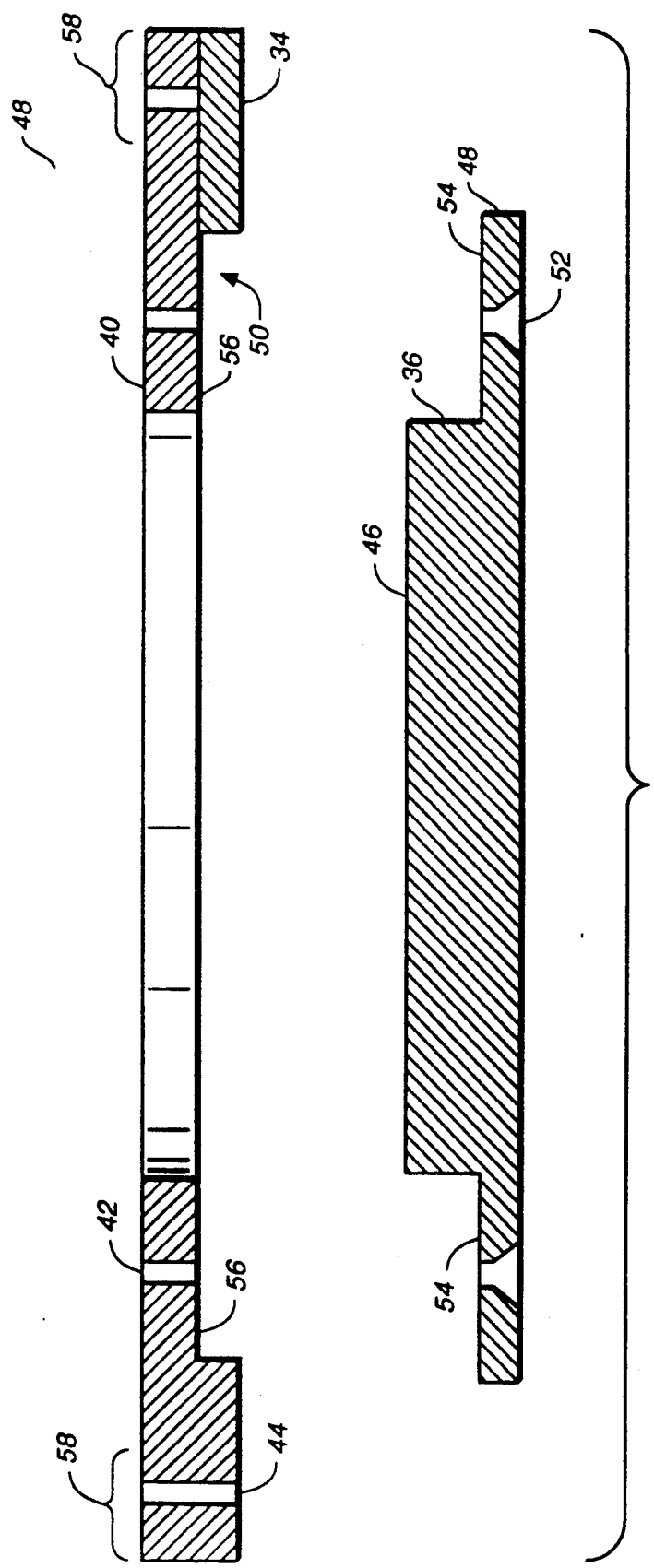
FIG._5

ETCHING SYSTEM HAVING SIMPLIFIED DIFFUSER ELEMENT REMOVAL

CROSS-REFERENCES TO RELATED APPLICATIONS

The present application is a continuation-in-part of parent application U.S. Ser. No. 07/564,801, filed Aug. 8, 1990 now abandoned.

BACKGROUND OF THE INVENTION

The present invention relates generally to semiconductor fabrication and more particularly to the design of a wafer etch system having simplified diffuser element removal. By simplifying diffuser element removal, operating efficiency can be enhanced.

Known wafer etching systems such as the GCA Wafer Etch System 606/616 manufactured by the GCA Corporation of Sunnyvale, Calif. or the Drytek Triode Wafer Etch System available from Drytek/Triode, a unit of General Signal, Inc. typically include a diffuser element in the form of a plate. The diffuser plate provides uniform distribution of, for example, a gas which is to be formed into a plasma discharge for etching a semiconductor wafer placed into the system. The semiconducter wafer is usually located between an upper electrode assembly and a lower electrode assembly of the etch system, with the diffuser plate being mounted in the upper electrode assembly.

A diffuser plate available with the upper electrode assembly of the aforementioned GCA or Drytek etch systems is shown in FIG. 1. As shown in FIG. 1, the diffuser plate 2 is formed as a unitary structure which includes a circular mounting portion 4 having four mounting holes 6 for receiving mounting bolts (not shown). The circular mounting portion encompasses an interior diffuser portion 8 having a number of diffusing holes 10 arranged about a center point of the diffuser plate.

A partial cross sectional schematic of an upper electrode assembly similar to that of the GCA or Drytek triode etch systems is shown in FIG. 2. As can be seen in FIG. 2, an upper electrode assembly 11 includes a tunnel portion 12 which encases a gas feed 13. The upper electrode assembly includes an electrically isolated upper electrode shown generally as element 15, which is placed at an RF potential and which is O-ring sealed into place by mounting the tunnel 12 onto an upper electrode housing 23. A cylindrically shaped upper chamber 21 supports the upper electrode housing 23 which includes a ground grid assembly 16 mounted to the housing 23 in known fashion.

More specifically, the upper electrode housing includes a flange 19 which forms a support for mounting the ground grid assembly. A clamping ring assembly 25 used for holding down the edge of a wafer(s) and for forming a sealed plasma zone is also mounted to the upper electrode housing 23. The ground grid assembly 16 (representing a middle electrode) is thus mounted directly beneath the upper electrode assembly and is placed at ground potential. The ground grid assembly is ceramically isolated from the upper electrode assembly in known fashion.

A ceramic insulator 18 is formed as part of the upper electrode assembly to support the upper electrode 15. When properly placed in the upper electrode assembly, the ceramic insulator 18 provides adequate space between the upper electrode housing 23 and the upper electrode 15 for supporting the diffuser plate 20, such as that described with respect to FIG. 1. The diffuser plate 20 is situated in a sealed, dark space area of the upper electrode assembly and is attached to the upper electrode so as to be placed at the RF potential of the upper electrode.

The diffuser plate 20 is mounted by inserting mounting bolts through holes in the diffuser plate and into threaded mounting holes 22 of the upper electrode 15. Because the threaded mounting holes 22 are formed in the upper electrode, and because the diffuser plate is mounted above the flange 19, the diffuser plate must be mounted to the upper electrode 15 before the upper electrode assembly 11 is assembled.

A lower electrode assembly 24 is further provided with a lower electrode at an RF potential. A plasma zone is formed in the interior of the upper electrode housing 23 between the ground grid assembly 16 and the electrode of the lower electrode assembly 24 via a hydraulic closing of the upper electrode assembly in a direction indicated by arrow 26. Upon closing of the upper electrode assembly, a wafer(s) placed near the lower electrode assembly is encompassed within the plasma zone whereby etching of the wafer(s) can be performed. The vaccum chamber is pumped during etching to a low vacuum state via a vacuum means 17 to draw gas from the upper electrode assembly into an area near the ground grid assembly area.

The aforedescribed wafer etch system thus uses a mounting system which permits an operator to access the diffuser plate and upper electrode assembly for regular cleaning and maintenance of the components. Such cleaning and regular maintenance of the diffuser plate and upper electrode assembly is necessary in order to remove particle build-up (e.g., polymers and residual gas build-up) on these parts due to high temperatures in the etching system. If ignored, the particle build-up can inhibit proper, accurate etching of wafers.

Any effort to access the diffuser plate requires the operator to dismantle the upper electrode assembly. However, dismantling of the upper electrode assembly involves significant time which results in significant maintenance and operating costs. In addition, the increased time over which the upper electrode assembly is dismantled during regular cleaning renders the etching system susceptible to contamination (e.g., due to particles, moisture) which cannot easily be removed and which can seriously impede proper operation of the etching system.

More specifically, because a number of mounting bolts and vacuum sealing rings are associated with the upper electrode assembly to provide an uncontaminated vacuum, great amounts of care and time must be expended to ensure proper reassembly of the upper electrode assembly following maintenance. However, the fear of prolonged upper electrode assembly exposure to the atmosphere significantly inhibits such precise reassembly and can result in human error during reassembly. Further, because the diffuser plate must be cleaned relatively frequently (e.g., preferably every 250 etched wafers, but at a minimum of every 500–1000 etched wafers), the entire upper electrode assembly is dismantled an excessive number of times (e.g., the upper electrode assembly is preferably dismantled for cleaning every 1500 etched wafers) such that the risk of improper reassembly due to errors is enhanced substantially.

While the lower side of the diffuser plate included in the aforedescribed etch systems can be cleaned from below without removal from the upper electrode system, several problems are associated with this technique. For example, cleaning the lower side of the diffuser plate with D.I. water placed upon a lint free cloth results in the migration of moisture through the diffuser plate and into the upper electrode assembly, thus inhibiting proper operation of the etch system. Further, prolonged exposure of the diffuser plate during cleaning enables particles and moisture to migrate into the upper electrode assembly.

Another technique is to leave the diffuser plate in place over a longer period of time by reducing the frequency with which preventative maintenance cleaning is performed. However, failure to regularly clean the diffuser plate can result in the production of wafers having a relatively high defect rate. For example, particulate formed by the plasma reactions in known etch systems can attach to all interior, exposed surfaces of the etching system. After sufficient build-up, the particulate may flake off onto a semiconductor wafer being etched and contaminate the wafer, thus reducing yields of properly fabricated wafers.

Accordingly, it would be desirable to provide a wafer etch system which does not incur the maintenance time and associated operating costs generally associated with semiconductor fabrication.

SUMMARY OF THE INVENTION

The present invention is directed to a method and apparatus for etching semiconductors such that operating costs can be significantly reduced. The present invention is based on diffuser element and system designs which facilitate etching system maintenance (e.g., cleaning) so as to reduce operating costs by reducing maintenance time. More specifically, diffuser elements used in conventional etching systems are only accessible by completely dismantling a substantial portion of the overall system including, for example, the upper electrode assembly. However, a diffuser plate must typically be cleaned more frequently (e.g., every 500–1000 wafers) than the entire upper electrode assembly.

By using systems and methods wherein the diffuser element can be removed independently of upper electrode assembly removal, maintenance time associated with diffuser plate cleaning can be substantially reduced (e.g., several hours per week of operation). Because a diffuser element should typically be cleaned at least 3–4 times more frequently than the upper electrode assembly, maintenance costs over the course of an annual operating period can therefore be reduced significantly. Further, use of a diffuser element which can be independently removed permits portions of an upper electrode assembly to be more frequently cleaned in place, thus further enhancing operability of the etching system without increasing operating costs.

BRIEF DESCRIPTION OF THE DRAWINGS

Other objects and advantages of the present invention will become more apparent from the following detailed description of the preferred embodiments as described in conjunction with the accompanying drawings in which:

FIG. 1 shows a known diffuser plate;

FIG. 2 shows a partial cross-sectional schematic of a side view of a conventional etching system;

FIG. 3 shows an exemplary embodiment of a diffuser plate designed in accordance with the present invention;

FIG. 4 shows a chart for identifying diffuser hole locations in the FIG. 3 exemplary embodiment; and, FIG. 5 shows an exemplary two-piece construction of the FIG. 3 exemplary embodiment.

DETAILED DESCRIPTION OF THE PREFERRED EMBODIMENT

In the following discussion of preferred embodiments, particular reference is made to a plasma diffusing means formed as a diffuser plate usable with conventional semiconductor wafer etching systems. It will be appreciated however that the present invention is not limited to diffusing means formed as a plate per se, but is equally applicable to any diffusing means included with any semiconductor wafer etching system wherein the diffusing means is mounted separately of an upper electrode assembly.

FIG. 3 shows an exemplary diffuser plate designed in accordance with an exemplary embodiment of the present invention for use with the semiconductor wafer etching system shown in FIG. 2. In FIG. 3, an actual size diffuser plate 30 is shown. Diffusing holes are provided at locations which correspond to those locations of the known FIG. 1 diffuser plate, relative to a center point of the diffuser plate. As with the FIG. 1 diffuser plate, seven circular rows of diffusing holes are provided in the FIG. 3 diffuser plate. The circular rows are thus drilled at varying radii from the center point of the diffuser plate 30.

As shown in the FIG. 4 chart, each row of diffusing holes at a given radius from a center point is presented in one of the seven vertical columns. The radius of each respective row is provided in inches as the last entry at the bottom of each FIG. 4 column. The number of diffusing holes in a given row is represented by the number of angular entries in each column, with all angular entries being referenced to a zero degree line drawn from the center of the FIG. 3 diffusing plate to a point along the perimeter of the diffusing plate.

For example, a first circular row of diffusing holes includes three such holes formed along a circle having a radius of 0.139 inches and being spaced from one another by 120 degrees. A second row is formed by diffusing holes spaced 60 degrees apart along a circle having a radius of 0.280 inches, and so forth. The diameter of all the diffusing holes can be formed to correspond with the diameter of the diffusing holes in the known FIG. 1 diffusing plate (e.g., approximately 0.026 inches as shown in FIG. 3).

In an exemplary embodiment, the FIG. 3 diffusing plate is formed as a two-piece design. A circular outer ring-like mounting element means 34 represents a first piece of the FIG. 3 design. A second piece of the FIG. 3 design is formed as a hat-like diffuser element means 36 having the diffusing holes 32 drilled therein.

A two-piece design for the FIG. 3 diffusing plate is shown more specifically in FIG. 5. In FIG. 5, the circular outer ring-like mounting element 34 is formed with a means 40 for receiving the hat-like diffuser element 36 which includes an elevated portion 46. The receiving means 40 is, for example, formed as a flange which extends inwardly from the outer perimeter of the ring-like mounting element 34.

An exemplary set of appropriate dimensions for the FIG. 3 diffuser plate will now be described for permitting the two-piece design of the FIG. 5 diffuser plate to be retrofit into the aforementioned GCA 606/616 Wafer Etch system. The outer diameter of the mounting element 34 is approximately 6 inches and has a height of 0.25 inches at its outer periphery. An inner diameter of the mounting element 34, as viewed from a bottom side of the diffuser plate at which the hat-like diffuser element 36 is to be received is 4.5 inches. This inner diameter of 4.5 inches extends 0.10 inches into the ring-like mounting element as viewed from the bottom side of the diffuser plate.

The receiving means 40 forms a circular inner area which has a diameter of 3.0 inches and which extends 0.15 inches to a top side of the ring-like mounting element. Thus, the receiving means is formed as a flange which extends 1.5 inches toward the center of the mounting element 34 and which is 0.15 inches in depth.

Threaded mounting holes 42 are provided in the mounting element 34 for receiving bolts which support the hat-like diffuser element 36. Four counter sunk mounting holes 42 are evenly spaced from the outer periphery of the mounting element 34 along a circle having a 2 inch radius. Four diffuser plate mounting holes 44 are further provided in the mounting element 34 for receiving bolts which attach the mounting element with threaded mounting holes of the upper electrode assembly 11 in, for example, the known GCA Etch System.

The hat-like diffuser element 36 is formed so as to removably interconnect in a mating fashion with the mounting element 34 as shown in FIG. 5. For this purpose, the hat-like diffuser element is formed with an elevation 46 having a diameter of 2.985 inches. When the hat-like diffuser element is interconnected with the mounting element 34, the elevation fits into the three inch inner area created by the flange 40. The elevation 46 includes the aforementioned diffuser holes and is formed to rise approximately 0.15 inches above a lower surface 48 of the hat-like diffuser element so as to match the depth of the flange 40.

The lower surface 48 of the hat-like diffuser element is formed with a diameter of 4.485 inches so as to fit within a cut-out area 50 of the mounting element, the cut-out area being formed by a bottom surface of flange 40. Mounting holes 52 are included in the hat-like diffuser element which holes match with the threaded mounting holes 42 on the mounting element 34. Mounting bolts (not shown) can therefore be inserted through the hat-like diffuser element 36 to firmly fasten the hat-like diffuser element to the mounting element 34.

The diffuser plate elements as shown in FIG. 5 can, for example, be formed of aluminum. Further, all surfaces of these elements can be anodized. Anodization refers to a chemical process whereby a thin layer of non-aluminum material is placed onto the diffuser plate elements to prevent them from being etched away during an operation wherein a plasma is being used to etch aluminum on a wafer. All areas of the FIG. 5 elements can be anodized except for those areas which, due to contact between the elements 34 and 36 or to contact between the mounting ring 34 and the upper electrode assembly, are not exposed to the etching plasma. Anodization can, for example, be achieved using a standardized class 1 hard anodization to a thickness of 0.002 inches (e.g., having 0.001 inch penetration into the diffuser plate and 0.001 inch build up above the diffuser plate surface).

For example, anodization between the mounting ring 34 and the upper electrode is avoided so that good contact between these components can be established for proper operation of the etch system. Accordingly, in the FIG. 5 embodiment, surfaces represented by numerals 54, 56 and 58 would not be anodized.

In accordance with the FIG. 5 embodiment, the mounting element 34 can be fixedly attached to the upper electrode via threaded mounting holes 44 during assembly of the upper electrode assembly. Afterwards, the hat-like diffuser element 36 can be fixedly attached to the mounting element 34 via mounting holes 52 and mounting holes 42. The rest of the etching system can then be assembled in known fashion.

Upon subsequent use of the etching system, the hat-like diffuser element can be accessed for cleaning by removing the mounting bolts inserted into the mounting holes 42 and 52 without dismantling the upper electrode assembly. More specifically, after raising the upper electrode assembly away from the lower electrode assembly, access to mounting bolts of the hat-like diffuser element is attained by removing the clamping ring assembly, removing the ground grid assembly, and then removing the mounting bolts, leaving the upper electrode assembly in place. During removal of these components, all seals and insulators associated with these components are also removed in known fashion.

Because the diffuser element 36 can be removed quite easily, cleaning of this element can be performed with much greater frequency, thus enhancing operation of the etching system without increasing operating costs. Further, at least a lower portion of the upper electrode assembly can be accessed for cleaning via the opening in the mounting portion 34 created by removal of the hat-like diffuser element so as to further enhance operation of the etching system without increasing operating costs.

It will be apparent to one skilled in the art that the FIG. 5 embodiment is merely exemplary, and that other forms of the invention could be used in conjunction with different etching systems. For example, the entire upper electrode assembly of an etching system such as the GCA Wafer Etch System could be redesigned to provide a unitary diffuser plate which mounts to a bottom portion of the upper electrode system (as viewed from a lower electrode assembly as shown in FIG. 2). Mounting means, such as bolts, can then be provided which are accessible through the bottom of the upper electrode housing.

In such an embodiment, the upper electrode housing would have to be redesigned to ensure that the flange 19 can properly support the weight of components included in the upper electrode assembly. Further, all 0-ring seals must be maintained. The diffuser plate can thus be formed similar to that shown in FIG. 1, with a key difference being in the mounting of the diffuser plate so as to permit removal independent of the upper electrode assembly.

It will be appreciated by those skilled in the art that the present invention can be embodied in other specific forms without departing from the spirit or essential characteristics thereof. The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. A system for etching semiconductor wafers comprising:
   an upper electrode assembly for producing a gas source, said upper electrode assembly including an upper electrode;
   a ground grid assembly mounted to the upper electrode assembly and forming an area which receives gas from said gas source; and
   a diffuser plate for diffusing said gas from said gas source into said area, said diffuser plate further including means for mounting said diffuser plate to said upper electrode assembly such that at least a portion of said diffuser plate can be removed from the wafer etching system independently of the upper electrode assembly.

2. A diffuser element for use in an area located between an upper electrode assembly and a ground grid assembly of a semiconductor wafer etching system having an upper electrode, a ground grid electrode and a lower electrode comprising:
   means for diffusing gas in said semiconductor wafer etching system, said diffusing means including a first portion and a second portion located within said upper electrode assembly; and
   means for mounting said first portion of said diffusing means to said upper electrode assembly such that said second portion of said diffusing means can be removed from said semiconductor wafer etching system independently of said upper electrode.

3. A diffuser element according to claim 2, wherein said first and second portions of said diffusing means are at least partially anodized.

4. A diffuser plate according to claim 2, wherein said first portion is a detachable, circular portion about a periphery of said second portion.

5. A diffuser element according to claim 4, wherein said second portion is formed as a hat-like element having an elevated portion.

6. A diffuser element according to claim 5, wherein said elevated portion is inserted into a receiving means of said first portion when said diffusing means is mounted to said upper electrode assembly.

7. A diffuser element according to claim 6, wherein said elevated portion is formed with a plurality of diffusing holes.

8. A diffusing element according to claim 7, wherein said diffusing holes are approximately 0.026 inches.

9. Method for disassembling a semiconductor wafer etching system having an upper electrode assembly for providing a source of gas into a plasma zone near a ground grid assembly via a diffuser plate comprising the steps of:
   removing a clamping ring assembly which forms a sealed plasma zone;
   removing a ground grid assembly which forms a ground electrode between said clamping ring assembly and said upper electrode assembly; and,
   removing a diffusing element of the diffuser plate from said semiconductor wafer etching system while leaving said upper electrode assembly mounted to said semiconductor wafer etching system.

10. System according to claim 1, further comprising:
    a clamping ring assembly for sealing said plasma zone, said mounting means being accessible by removing said clamping ring assembly and said ground grid assembly.

11. System according to claim 10, wherein said diffusing plate further includes:
    a ring-like element mounted to said upper electrode assembly; and
    a hat-like element mounted to said ring-like element and having an elevated portion, a center portion of said ring-like element receiving said hat-like element when said diffuser plate is mounted to said upper electrode assembly.

12. System according to claim 1, further comprising:
    a lower electrode assembly for supporting a wafer, said grid assembly being located between said upper electrode and said ground grid assembly.

* * * * *